United States Patent
Yu et al.

(10) Patent No.: US 10,392,247 B2
(45) Date of Patent: Aug. 27, 2019

(54) FABRICATION PROCESS FOR A SYMMETRICAL MEMS ACCELEROMETER

(71) Applicant: Chinese Academy of Sciences Institute of Geology and Geophysics, Beijing (CN)

(72) Inventors: Lianzhong Yu, Beijing (CN); Chen Sun, Beijing (CN); Leiyang Yi, Beijing (CN)

(73) Assignee: CHINESE ACADEMY OF SCIENCES INSTITUTE OF GEOLOGY AND GEOPHYSICS, Beijing (CN)

( * ) Notice: Subject to any disclaimer, the term of this patent is extended or adjusted under 35 U.S.C. 154(b) by 50 days.

(21) Appl. No.: 15/659,963

(22) Filed: Jul. 26, 2017

(65) Prior Publication Data

US 2017/0336437 A1 Nov. 23, 2017

Related U.S. Application Data

(62) Division of application No. 14/799,480, filed on Jul. 14, 2015, now Pat. No. 9,759,740.

(30) Foreign Application Priority Data

Jul. 16, 2014 (CN) .......................... 2014 1 0340002

(51) Int. Cl.
*B81C 3/00* (2006.01)
*G01P 15/125* (2006.01)
(Continued)

(52) U.S. Cl.
CPC ............ *B81C 3/001* (2013.01); *B81C 1/0019* (2013.01); *B81C 1/00134* (2013.01);
(Continued)

(58) Field of Classification Search
CPC ...... B81C 2201/013; B81C 2201/0132; B81C 2201/0133; B81C 1/00531;
(Continued)

(56) References Cited

U.S. PATENT DOCUMENTS

| | | | |
|---|---|---|---|
| 5,652,384 A | 7/1997 | Henrion | |
| 7,337,671 B2 | 3/2008 | Ayazi | |
| 2016/0238390 A1* | 8/2016 | Yu | ........................ G01C 19/574 |

FOREIGN PATENT DOCUMENTS

| | | |
|---|---|---|
| CN | 1605871 A | 4/2005 |
| CN | 102768290 A | 11/2012 |

* cited by examiner

*Primary Examiner* — Scott B Geyer
(74) *Attorney, Agent, or Firm* — Dergosits & Noah LLP

(57) ABSTRACT

A method for fabricating a symmetrical MEMS accelerometer. For each half, etch multiple holes on the bottom of an SOI wafer; form multiple hollowed parts on the top of a silicon wafer; form silicon dioxide on the top and bottom of the silicon wafer; bond the top of the silicon wafer with the bottom of the SOI wafer; deposit silicon nitride on the bottom of the silicon wafer, remove parts of the silicon nitride and silicon dioxide to expose the bottom of the silicon wafer; etch the exposed bottom of the silicon wafer; reduce the thickness of the SOI wafer; remove the silicon nitride and exposed bottom. Bond the two halves along their bottom surface to form the accelerometer. Form a bottom cap including electrodes. Bond the bottom cap and the accelerometer. Deposit metal on top of the silicon wafer.

5 Claims, 25 Drawing Sheets

(51) Int. Cl.
*B81C 1/00* (2006.01)
*G01P 15/08* (2006.01)
(52) U.S. Cl.
CPC ...... *B81C 1/00269* (2013.01); *B81C 1/00357* (2013.01); *B81C 1/00396* (2013.01); *B81C 1/00531* (2013.01); *B81C 1/00539* (2013.01); *G01P 15/125* (2013.01); *B81B 2201/0235* (2013.01); *B81B 2203/051* (2013.01); *B81C 2201/014* (2013.01); *B81C 2201/019* (2013.01); *B81C 2201/0132* (2013.01); *B81C 2201/0133* (2013.01); *G01P 2015/0814* (2013.01)
(58) Field of Classification Search
CPC . B81C 1/00539; B81C 1/00547; B81C 3/001; B81C 2201/019; B81C 2203/0109; B81C 2203/0118; B81C 1/00269; B81C 1/00357; B81C 2201/014; B81C 1/00396; B81C 1/00134; B81C 1/0019
See application file for complete search history.

FABRICATION PROCESS FOR A SYMMETRICAL MEMS ACCELEROMETER

CROSS REFERENCE

This application is a division of U.S. patent application Ser. No. 14/799,480, filed Jul. 14, 2015, entitled A Symmetrical MEMS Accelerometer and its Fabrication Process, and claiming priority from Chinese Patent Application No. 201410340002.5, filed Jul. 16, 2014, entitled A Symmetrical MEMS Accelerometer and its Fabrication Process.

BACKGROUND

This invention relates to a sensor, particularly to an accelerometer, its fabrication method and acceleration sensors which includes such accelerometer.

Nowadays, accelerometers have been used in various applications, such as, measuring the magnitude of earthquake and gathering seismic data, detecting the magnitude of collision during a car collision, and detecting the tilting direction and angle of a mobile phone or a game console. As the micro-electro-mechanical systems (MEMS) technology continues to progress, many nano-scale accelerometers have been widely commercially used.

In general, the accelerometers can be categorized into two kinds, one is parallel plate accelerometer, such as Chinese invention patent with publication No. CN102768290A. The parallel plate accelerometer measures the acceleration through the parallel plate capacitor formed between the top cap, the mass, and the bottom cap. When there is an acceleration, the frame displaces towards the direction of acceleration, but due to inertia, the displacement of the mass is relatively small causing the distance or the area of projection between the top cap, the mass, and the bottom cap to change. The capacitance between the top cap, the mass, and the bottom cap also changes. Integrated circuits calculates the direction and magnitude of the acceleration based on the change of capacitance.

Another type of accelerometer is comb structure accelerometer, such as Chinese invention patent with publication No. CN1605871. Comb structure accelerometer detects acceleration by measuring the change in capacitance of two spaced apart comb structures. The comb structure comprise movable teeth provided on the mass, and fixed teeth adjacent to the movable teeth. As the mass displaces due to acceleration, the movable teeth also displaces; thus the distance or the area of projection between the movable teeth and the fixed teeth changes, leading to a change in capacitance. Integrated circuits calculates the direction and magnitude of the acceleration based on the change of capacitance.

In a parallel plate accelerometer, the mass is relatively large, and the relation between the measurement accuracy and the mass is shown in:

$$\text{Acceleration due to noise: } \bar{a} = \frac{F_n}{A_1} = \frac{F_n}{m} = \sqrt{\frac{4k_B T \omega_0}{mQ}}$$

where $k_B$ represents Boltzmann constant, T represents temperature, $\omega_0$ represents resonance frequency, Q represents quality factor, m represents mass. Therefore, when the resonance frequency and the quality factor are fixed, increasing the mass reduces the effect by noise. The capacitance formed between the mass and the cap is also relatively large, which means the sensitivity is high. However, during fabrication, parallel plate accelerometer has a high squeeze-film damping force; thus it requires vacuum environment for packaging, which dramatically increases the packaging and fabrication cost. In comparison, the comb structure accelerometer has a low squeeze-film damping force. Based on the book "Analysis and Design Principles of MEMS Devices" the coefficient of damping force in MEMS chip can be calculated by:

$$c_{rec} = \frac{\mu L B^3}{h^3} \beta\left(\frac{B}{L}\right), \text{ where } L \gg B, \beta = 1, \beta = 0.42;$$

For example, the coefficient of damping force of 1000 um×1000 um accelerometer with 100 pairs of 500 um×20 um comb teeth is 1.5% of the coefficient of damping force of 1000 um×1000 um accelerometer without comb teeth. Therefore, comb structure accelerometers can be packaged under non-vacuum environment, which means the packaging cost is low. However, due to the characteristics of comb structure, the mass is relatively small, and the capacitance in a comb structure accelerometer is smaller than parallel plate accelerometer. Thus, the sensitivity of comb structure accelerometer is lower compared with parallel plate accelerometer. Furthermore, comb structures are fabricated by using photolithography and etching. The spacing between the movable teeth and the fixed teeth is limited by the etching process to 2 um. On the other hand, parallel plate accelerometers are fabricated by bonding, the spacing between the mass and the caps can be controlled in 1 um. However, the accuracy of bonding technique is lower than photolithography and etching. In conclusion, both parallel plate accelerometers and comb structure accelerometers have their own advantages and disadvantages.

SUMMARY OF INVENTION

The present invention is intended to combine the advantages of these two types of accelerometers and overcome their disadvantages, and to provide an accelerometer with high sensitivity and accuracy, but with low packaging and fabrication cost.

The present invention provides a symmetrical MEMS accelerometer, characterized in that, the accelerometer comprises a top half part and a bottom half part, the top half part and the bottom half part are bonded to form the frame and the mass within the frame; the frame and the mass are connected through resilient beams; a plurality of hollowed parts and the first connecting parts are respectively formed on the top and bottom side of the mass; and the second connecting parts are respectively formed on the top and bottom side of the frame. The resilient beams connect the first connecting part with the second connecting part. Several groups of comb structures are formed on top of the hollowed parts; each comb structure includes a plurality of moveable teeth and fixed teeth; the moveable teeth are extended from the first connecting parts, and the fixed teeth are extended from the second connecting parts. Capacitance is formed between the movable teeth and the fixed teeth.

The present invention also has the following additional features. The first connecting part comprises a plurality of parallel horizontal beams, and a vertical beam connecting the horizontal teeth; movable teeth are extended from two sides of each said horizontal beams. The mass and the frame have a symmetrical structure. The first connecting part has an "I" shape, which comprises two parallel horizontal beams, and one vertical beam connecting the horizontal beams. The resilient beams are folded beams, which are connected to the ends of the horizontal beams. Electrodes are deposited on the first connecting part and the second connecting part.

The accelerometer detects the acceleration by measuring the change in capacitance caused by the change in overlapping area between the sides of the movable teeth and the sides of the fixed teeth. The accelerometer detects the acceleration by measuring the change in capacitance caused by the change in distance between the sides of the movable teeth and the sides of the fixed teeth.

Each half part of the accelerometer comprises the first silicon layer and the second silicon layer; the first connecting part, the second connecting part, the resilient beams, and the comb structures are formed in the first silicon layer; the frame and the mass are formed in the second silicon layer; a silicon dioxide layer is provided between the first silicon layer and the second silicon layer.

The accelerometer uses a silicon-on-insulator wafer, which comprises a top silicon layer and a bottom silicon layer; the first connecting part, the second connecting part, the resilient beams, and the comb structures are formed in the top silicon layer; the frame and the mass are formed in the bottom silicon layer; a silicon dioxide layer is provided between the top silicon layer and the bottom silicon layer.

The accelerometer comprises a silicon-on-insulator wafer and a silicon wafer bonded on the surface of the silicon-on-insulator wafer, a layer of silicon dioxide is formed on the bonding surface between the silicon wafer and the silicon-on-insulator wafer; the silicon-on-insulator wafer comprises top silicon layer, buried oxide layer, and bottom silicon layer; the first connecting part, the second connecting part, the resilient beams, and the comb structures are formed in the bottom silicon layer, the frame and the mass are formed in the silicon wafer.

A fabrication process for the symmetrical MEMS accelerometer, wherein, the fabrication process comprises the following steps:

Step 1, use photolithography and deep etching to etch multiple holes on the bottom surface of the first silicon wafer to form the resilient beams, the first connecting parts, the second connecting parts, and the comb structures;

Step 2, use photolithography and deep etching to etch multiple hollowed parts on the top surface of the second silicon wafer;

Step 3, use thermal oxidation or chemical deposition to form a silicon dioxide layer on the surface of the second silicon wafer;

Step 4, bond the bottom surface of the first silicon wafer with the top surface of the second silicon wafer;

Step 5, deposit a layer of silicon nitride on the bottom surface of the second silicon wafer, and use photolithography and deep etching to remove parts of the silicon nitride layer and silicon dioxide layer on the bottom surface of the second silicon wafer;

Step 6, deep etch the exposed parts of the bottom surface of the second silicon wafer to the silicon dioxide layer located on the top surface of the second silicon wafer; and reduce the thickness of the first silicon wafer;

Step 7, remove the silicon nitride layer, etch the silicon dioxide to form the mass;

Step 8, bond two half parts of the accelerometer, which are fabricated according to the previous steps, along their bottom surface;

Step 9, use deep etching to form the movable accelerometer;

Step 10, fabricate the bottom cap by hollowing the corresponding area, and deposit metal as electrodes;

Step 11, bond the accelerometer with the bottom cap; and

Step 12, deposit metal on the first silicon wafer to form electrodes.

A fabrication process for the symmetrical MEMS accelerometer, wherein, the fabrication process comprises the following steps:

Step 1, use thermal oxidation or chemical deposition to form a silicon dioxide layer on the surface of the silicon-on-insulator wafer;

Step 2, use photolithography and etching to etch multiple holes on the silicon dioxide layer located on the top surface of the silicon-on-insulator wafer with depth to the top silicon layer and hollowed parts on the silicon dioxide layer located on the bottom surface of the silicon-on-insulator wafer with depth to the bottom silicon layer;

Step 3, deposit a layer of silicon nitride on the top and bottom surface of the silicon-on-insulator wafer;

Step 4, use photolithography and etching to remove part of the silicon nitride on the bottom surface of the silicon-on-insulator wafer, and expose the bottom silicon layer;

Step 5, deep etch the bottom silicon layer to the buried oxide layer;

Step 6, use etching to remove the silicon nitride and silicon dioxide layer on the bottom surface of the silicon-on-insulator wafer;

Step 7, bond two half parts of the accelerometer, which are fabricated according to the previous steps, along their bottom surface;

Step 8, remove the silicon nitride on both sides, and deep etch the exposed parts of the top silicon layers to the buried oxide layer, thus forms the first connecting parts, the second connecting parts, the resilient beams and the comb structures;

Step 9, use thermal oxidation or chemical deposition to form a silicon dioxide layer on the exposed surfaces of the top silicon layers and bottom silicon layers;

Step 10, use etching to remove the buried oxide layer located in the holes of the top silicon layers;

Step 11, use deep etching to etch the holes in top silicon layers to a certain depth;

Step 12, etch the holes horizontally to form the hollowed parts and movable resilient beams;

Step 13, remove the silicon dioxide layer on the surface of the silicon-on-insulator wafer to form the accelerometer;

Step 14, fabricate the bottom cap by hollowing the corresponding area, and deposit metal as electrodes;

Step 15, bond the accelerometer with the bottom cap; and

Step 16, deposit metal on the first silicon wafer to form electrodes.

A fabrication process for the symmetrical MEMS accelerometer, wherein, the fabrication process comprises the following steps:

Step 1, use photolithography and deep etching to etch multiple holes on the bottom surface of the silicon-on-insulator wafer with depth to the buried oxide layer, thus forming the first connecting part, the second connecting part, the resilient beams, and the comb structures;

Step 2, use photolithography and deep etching to etch multiple hollowed parts on the top surface of the silicon wafer;

Step 3, use thermal oxidation or chemical deposition to form a silicon dioxide layer on the top and bottom surface of the silicon wafer;

Step 4, bond the top surface of the silicon wafer with the bottom surface of the silicon-on-insulator wafer;

Step 5, deposit silicon nitride on the bottom surface of the silicon wafer, then use photolithography and etching to remove part of the silicon nitride, silicon dioxide layer on the bottom surface of the silicon wafer to expose part of the bottom surface of the silicon wafer;

Step 6, deep etch the exposed parts of the bottom surface of the silicon wafer to the silicon dioxide layer to form the mass, and reduce the thickness of the silicon-on-insulator wafer;

Step 7, use etching to remove the silicon nitride layer and exposed parts of silicon dioxide layer on the bottom surface of the silicon wafer;

Step 8, bond two half parts of the accelerometer, which are fabricated according to the previous steps, along their bottom surface;

Step 9, use deep etching and etching to remove the top silicon layers and silicon dioxide layers to form the accelerometer;

Step 10, fabricate the bottom cap by hollowing the corresponding area, and deposit metal as electrodes;

Step 11, bond the accelerometer with the bottom cap; and

Step 12, deposit metal on the first silicon wafer to form electrodes.

The deep etching or etching method is selected from one or more following methods: dry etching or wet etching; and the dry etching comprises silicon deep reactive ion etching or reactive ion etching.

The etchant for etching the silicon layer comprises one kind or a combination of the following etchants: potassium hydroxide, tetramethylammonium hydroxide, ethylenediamine pyrocatechol or gaseous xenon difluoride.

The etchants for etching the silicon dioxide layer comprises one kind or a combination of the following etchants: buffered hydrofluoric acid, 49% hydrofluoric acid or gaseous hydrogen fluoride.

The etchants for etching the silicon nitride layer comprises one kind or a combination of the following etchants: hot concentrate phosphoric acid and hydrofluoric acid.

The present accelerometer has the following advantages. Firstly, the present accelerometer has combined the parallel plate accelerometer design and the comb structure accelerometer design. By binding two half parts along the vertical direction, it forms a larger mass. A plurality of hollowed parts are formed on the top and bottom side of the mass; and the comb structures, which are used for acceleration detection, are formed above the hollowed parts. The present design not only has a large mass, thus increases the sensitivity of the accelerometer; it also isolates the acceleration detecting part, i.e., the comb structure, from the mass. The detecting part has a low squeeze-film damping force. The packaging requirement is low, so is the fabrication cost. Furthermore, the comb structure on the top side and the comb structure on the bottom side can be the same structure, and the accelerometer outputs two almost identical signals. Integrated circuit chips can compare the signal to isolate noise, thus providing increased accuracy. Or, the comb structure on the top side and the comb structure on the bottom side can be different structures. A person skilled in art can design the structures based on its application and requirements. Moreover, since there are no electrodes placed on the caps, the bonding accuracy between the caps and the accelerometer is low, and the bonding process can be simplified to further reduce the fabrication cost. If it is necessary to perform packaging in a vacuum environment, getter can be placed on the caps.

The present accelerometer can be fabricated through various methods, including using two silicon wafers, one silicon-on-insulator wafer, or one silicon-on-insulator wafer bonded with one silicon wafer. The caps are made of silicon, Pyrex glass, or borosilicate glass. Manufactures can choose the fabrication material and method based on accelerometer's performance requirements and cost factors.

DETAILED DESCRIPTION

The present invention will be described in further detail below with reference to the drawings and specific embodiments.

Figure 1:
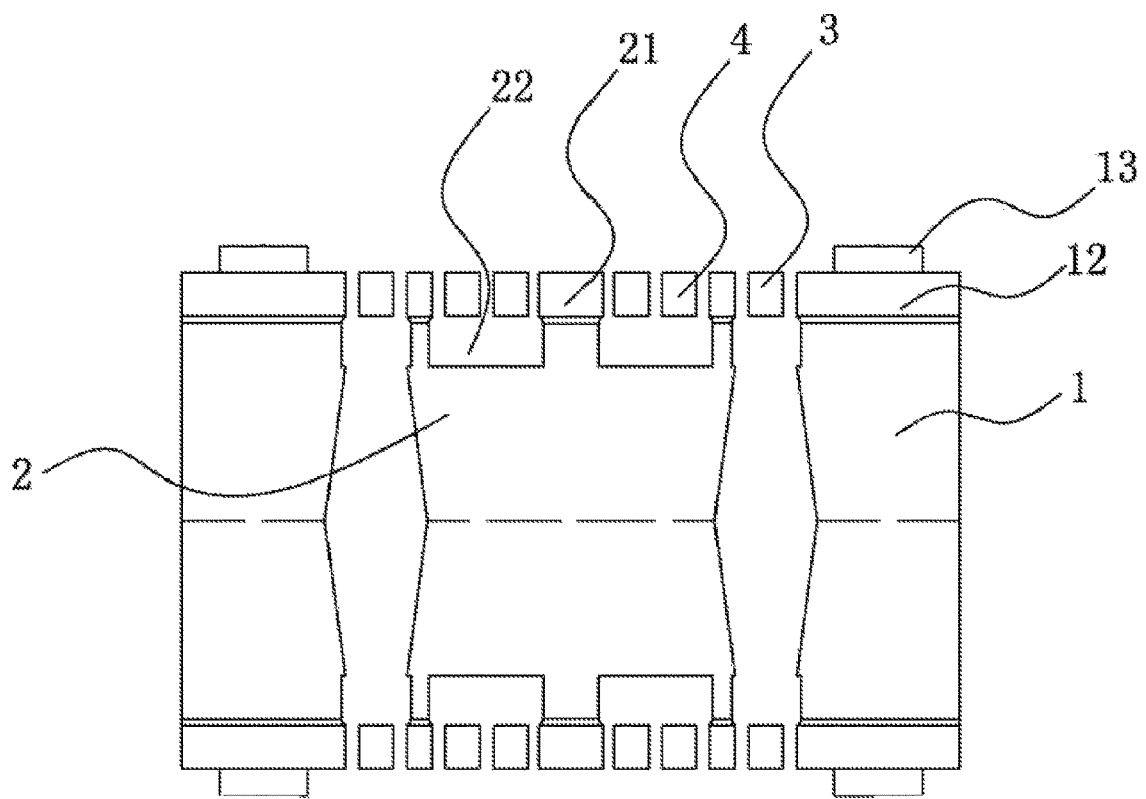
FIG. 1 is a structure scheme of the present invention.
Figure 2:
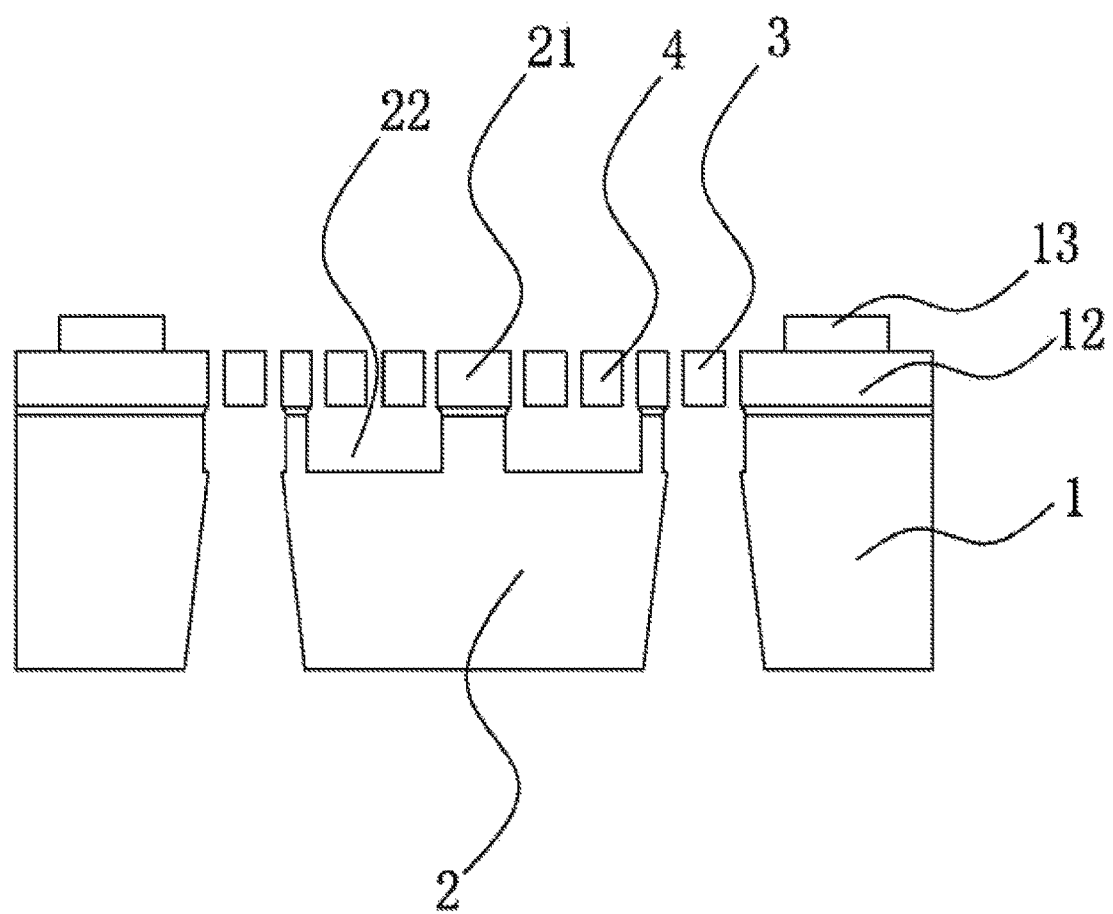
FIG. 2 is a structure scheme of a half part of the present invention.
Figure 3:
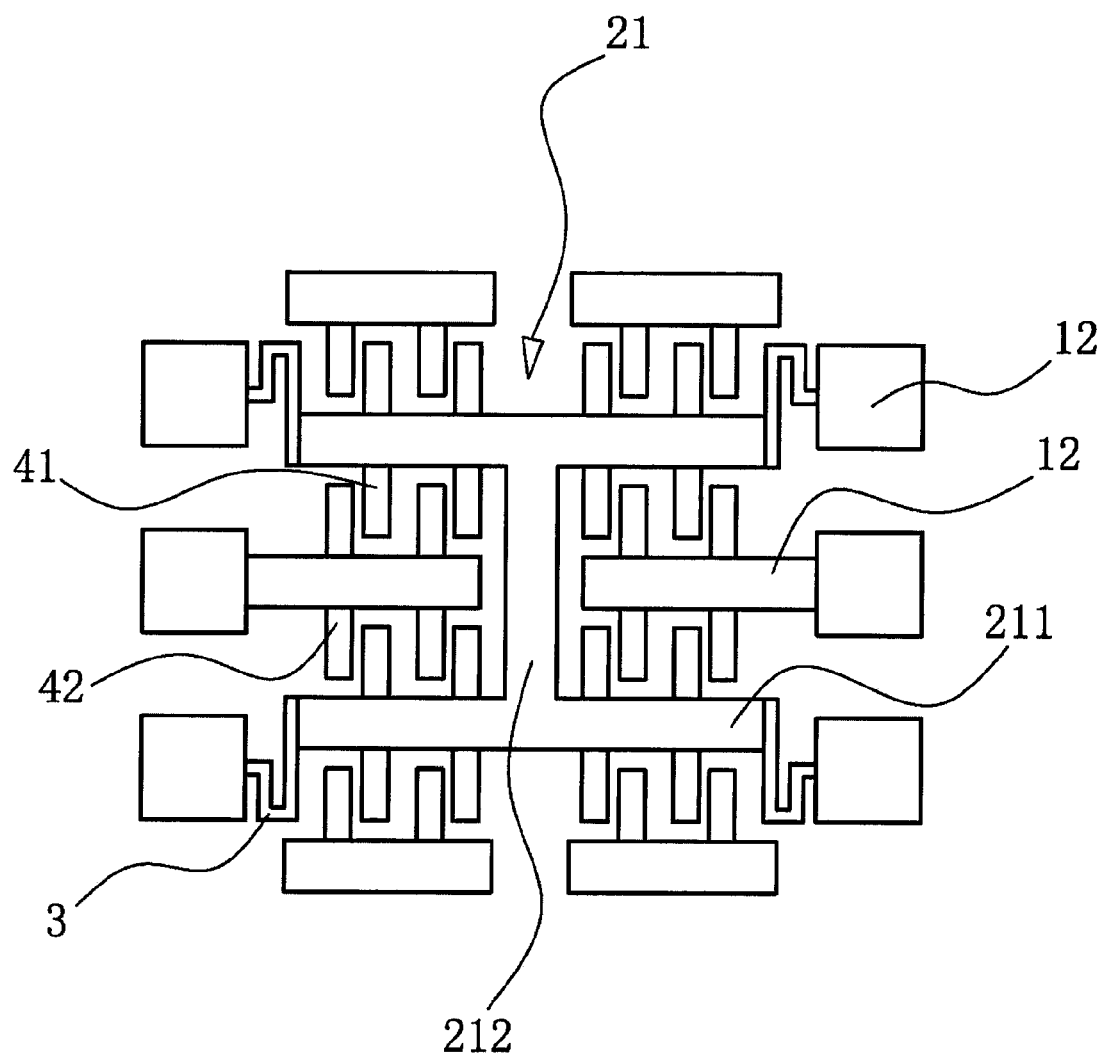
FIG. 3 is a top view of the accelerometer

With reference to FIGS. 1 to 3, the present invention provides a symmetrical MEMS accelerometer, the accelerometer is formed by bonding the top half part and the bottom half part along the dashed lines in FIG. 1. Each half part includes: a frame 1, a mass 2 provided within the frame, and a pluralities of resilient beams 3 connecting the frame 1 and the mass 2. The first connecting part 21 and a plurality of hollowed parts are formed on the mass 2; and the second connecting part 12 is formed on the frame 1. The first connecting part is located on top of the hollowed parts 22. The resilient beams connect the first connecting part 21 and the second connecting part 12. Several groups of comb structures 4 are provided within the hollowed parts 22.

With reference to FIG. 3, preferably, the first connecting part 21 has an "I" shape, which includes several horizontal beams 211 and one vertical beam 212; the vertical beam 212 connects all the horizontal beams 211. As shown in FIG. 2, the resilient beams 3 are provided at four corners, and they are connected with the end of the horizontal beams 211. The "I" shaped connecting part is a preferable embodiment; the number and the position of the horizontal beams 211 and vertical beams 212 are varied based on specific designs.

With reference to FIG. 3, some moveable teeth 41 are extended from the sides of each horizontal beam 211. The fixed teeth 42 are provided on the second connecting part 12 spaced apart from the movable teeth 41. Both the movable teeth 41 and the fixed teeth 42 are located above the hollowed part, and they can move freely. After connecting with electric circuits, capacitance is formed between the movable teeth 41 and the fixed teeth 42. While measuring acceleration, the mass 2 moves along the direction of acceleration. According to formula C=εA/d, the capacitance between two parallel plates is calculated based on the dielectric constant times the area of projection deleted by the vertical distance between two plates. Therefore, as the mass 2 displaces according to the acceleration, the space between the movable teeth 41 and the fixed teeth 42 also changes. Integrated circuit chips can calculate the acceleration based on the change in capacitance. In one embodiment, when the mass 2 displaces, the projecting area between the side of the movable teeth 41 and the side of the fixed teeth 42 changes, thus causing change in capacitance, and the integrated circuit chips calculates the acceleration based on the change in capacitance.

With reference to FIG. 2, each half part of the present accelerometer is formed by two layers of silicon. The first connecting part 21, the second connecting part 12, the resilient beams 3 and the comb structures 4 are formed in the first silicon layer 5. The frame 1 and the mass 2 are formed in the second silicon layer 6. A silicon dioxide layer is formed between the first silicon layer 5 and the second silicon layer 6 to separate and isolate noise and disturbance.

With reference to FIGS. 1 to 3, the present accelerometer combines two kinds of traditional accelerometers, and has the advantage of each kind of traditional accelerometer. From one perspective, by bonding two half parts, the present accelerometer has a greater mass 2, thus increases the sensitivity and the ability to detect tiny accelerations. Also, its comb structure reduces the squeeze-film damping force, thus lowers the packaging requirements. Furthermore, the comb structure on the top half part and the comb structure on the bottom half part can have the same structure, or they can have different structures. When they have the same structure, the accelerometer outputs two sets of almost identical signals. The integrated circuit chip can compare these signals to obtain a more accurate measurement. Or, these two comb structures can be different depending on the design requirements.

There are several methods for manufacturing the present accelerometer, as illustrated in FIGS. 6A to 25B, which explain each manufacturing method in detail.

FIGS. 6A to 11B show the first fabrication method of the present accelerometer. This method adopts two silicon wafers, which are the first silicon wafer 51 and the second silicon wafer 61, to fabricate the accelerometer. The first method includes the following steps:

Step 1 (FIG. 6A), coat a layer of photoresist on the bottom surface of the first silicon wafer 51. Then expose according to certain patterns, and develop with developers to make the patterns apparent. Then etch the exposed parts of the bottom surface to a certain depth using deep reactive ion etching; thus forms the resilient beams 3, the first connecting part 21, the second connecting part 12 and the comb structure 4. The photoresist is removed in the end.

Step 2 (FIG. 6B), coat a layer of photoresist on the top surface of the second silicon wafer 61. Then expose according to certain patterns, and develop with developers to make the patterns apparent. Then etch the exposed parts of the top surface to a certain depth using deep reactive ion etching; thus forms multiple hollowed parts 22. The photoresist is removed in the end.

Step 3 (FIG. 7A), use thermal oxidation to form a layer of silicon dioxide 7 on the top and bottom surface of the second silicon wafer 61; or use chemical vapor deposition (CVD) method to deposit a layer of silicon dioxide 7;

Step 4 (FIG. 7B), bond the bottom surface of the first silicon wafer 51 with the top surface of the second silicon wafer 61.

Step 5 (FIG. 8A), use chemical vapor deposition (CVD) method to deposit a layer of silicon nitride 8 on the bottom surface of the second silicon wafer 61. Then coat a layer of photoresist on the bottom surface of the second silicon wafer 61. Then expose according to certain patterns, and develop with developers to make the patterns apparent. Then remove the exposed parts of the silicon nitride layer 8 and silicon dioxide layer 7 using deep reactive ion etching or buffered hydrofluoric acid.

Step 6 (FIG. 8B), etch the exposed parts of the bottom surface of the second silicon wafer 61 to the silicon dioxide layer 7 on the top surface of the second silicon wafer 61 using deep reactive ion etching, potassium hydroxide, or tetramethylammonium hydroxide, or ethylenediamine pyrocatechol. Also etch the first silicon wafer to reduce its thickness.

Step 7 (FIG. 9A), remove the silicon nitride layer 8 by using dry reactive ion etching or hot concentrated phosphoric acid. Then remove the exposed parts of the silicon dioxide 7 by using buffered hydrofluoric acid or hydrogen fluoride gas; thus form one half part of the accelerometer.

Step 8 (FIG. 9B), bond two half parts, which are made according to the previous steps, along their bottom surfaces; thus form a complete accelerometer.

Step 9 (FIG. 10A), deep silicon etch the accelerometer to form a movable accelerometer.

Step 10 (FIG. 10B), fabricate the bottom cap by hollowing the corresponding area, and deposit metal as electrodes.

Step 11 (FIG. 10B), bond the accelerometer with the bottom cap.

Step 12 (FIG. 11A), deposit metal on the first silicon wafer 51 to form electrodes.

FIGS. 12A to 19B show the second fabrication method of the present accelerometer. This method adopts one silicon-on-insulator (SOI) wafer to fabricate the accelerometer. The SOI wafer includes a top silicon layer 52, a silicon dioxide layer 7, and a bottom silicon layer 62. The second method includes the following steps:

Step 1 (FIG. 12A), grow a silicon dioxide layer 7 on the top and bottom surface of the SOI wafer by thermal oxidation; or deposit a layer of silicon dioxide 7 using chemical vapor deposition (CVD) method.

Step 2 (FIG. 12B), coat a layer of photoresist on the top and bottom surface of the SOI wafer. Then expose according to certain patterns, and develop with developers to make the patterns apparent. Then etch the exposed parts of the silicon dioxide layer 7 by using dry reactive ion etching or buffered hydrofluoric acid; thus forms multiple holes with depth to the top silicon layer 52 on the top surface, and a hallowed part with depth to the bottom silicon layer 62 on the bottom surface.

Step 3 (FIG. 13A), deposit a layer of silicon nitride 8 on the top and bottom surface of the SOI wafer by using CVD method.

Step 4 (FIG. 13B), coat a layer of photoresist on the bottom surface of the SOI wafer. Then expose according to certain patterns, and develop with developers to make the patterns apparent. Then remove the exposed parts of the silicon nitride layer 8 by using dry reactive ion etching or hot concentrated phosphoric acid; thus exposing part of the bottom silicon layer 62.

Step 5 (FIG. 14A), etch the exposed parts of the bottom silicon layer 62 to silicon dioxide layer 7 by using deep reactive ion etching, potassium hydroxide, or tetramethyl-ammonium hydroxide, or ethylenediamine pyrocatechol.

Step 6 (FIG. 14B), remove the silicon nitride layer 8 on the bottom surface of the SOI wafer by using dry reactive ion etching or hot concentrated phosphoric acid; and remove the silicon dioxide layer 7 on the bottom surface of the SOI wafer by using dry reactive ion etching or buffered hydrofluoric acid.

Step 7 (FIG. 15A), bond two half parts, which are made according to the previous steps, along their bottom surfaces; thus form a complete accelerometer.

Step 8 (FIG. 15B), remove the silicon nitride layer 8 deposited on the top and bottom surfaces of the SOI wafer by using dry reactive ion etching or hot concentrated phosphoric acid. Then etch the exposed part of top silicon layer 52 to silicon dioxide layer 7 by using deep reactive ion etching; thus forming the first connecting part 12, the second connecting part 21, resilient beams 3, and comb structures 4.

Step 9 (FIG. 16A), grow a silicon dioxide layer 7 on the surface of the SOI wafer by thermal oxidation; or deposit a layer of silicon dioxide 7 using chemical vapor deposition (CVD) method.

Step 10 (FIG. 16B), remove the silicon dioxide layer 7 located within the holes of top silicon layer 52 by using dry reactive ion etching.

Step 11 (FIG. 17A), etch the exposed parts of the bottom silicon layer 62 to a certain depth by using deep reactive ion etching.

Step 12 (FIG. 17B), etch the holes horizontally by using potassium hydroxide, or tetramethylammonium hydroxide, or ethylenediamine pyrocatechol, or gaseous xenon difluoride; thus forming the hollowed parts 22 and movable resilient beams 3.

Step 13 (FIG. 18A), remove the silicon dioxide layer 7 on the surface of the SOI wafer by using dry reactive ion etching or buffered hydrofluoric acid, thus forming the accelerometer.

Step 14 (FIG. 18B), fabricate the bottom cap by hollowing the corresponding area, and deposit metal as electrodes.

Step 15 (FIG. 19A), bond the accelerometer with the bottom cap.

Step 16 (FIG. 19B), deposit metal on the top SOI wafer to form electrodes.

FIGS. 20A to 25B show the third fabrication method of the present accelerometer. This method adopts a silicon wafer 64 and a SOI wafer, to fabricate the accelerometer. The third method includes the following steps:

Step 1 (FIG. 20A), coat a layer of photoresist on the surface of the bottom silicon layer 63. Then expose according to certain patterns, and develop with developers to make the patterns apparent. Then etch the exposed parts of the bottom silicon layer 63 by using deep reactive ion etching to form multiple holes with depth to the silicon dioxide layer 7; thus forming the first connecting part 21, the second connecting part 12, the resilient beams 3, and the comb structures 4.

Step 2 (FIG. 20B), coat a layer of photoresist on the top surface of the silicon wafer 64. Then expose according to certain patterns, and develop with developers to make the patterns apparent. Then etch the exposed parts of the top surface of the silicon wafer 64 by using deep reactive ion etching to form multiple hollowed parts 22.

Step 3 (FIG. 21A), grow a silicon dioxide layer 7 on the surface of the silicon wafer 64 by thermal oxidation; or deposit a layer of silicon dioxide 7 using chemical vapor deposition (CVD) method.

Step 4 (FIG. 21B), bond the top surface of the silicon wafer 64 with the bottom surface of the SOI wafer.

Step 5 (FIG. 22A), deposit a layer of silicon nitride 8 on the bottom surface of the \silicon wafer. Then coat a layer of photoresist on the silicon nitride layer 8. Then expose according to certain patterns, and develop with developers to make the patterns apparent. Remove the exposed part of the silicon nitride layer 8 by using dry reactive ion etching or hot concentrated phosphoric acid. Then remove the exposed silicon dioxide layer 7 by using dry reactive ion etching or buffered hydrofluoric acid, so that part of the silicon 64 surface is exposed.

Step 6 (FIG. 22B), etch the exposed part of the silicon wafer 64 to the silicon dioxide layer 7 by using potassium hydroxide, or tetramethylammonium hydroxide, or ethylenediamine pyrocatechol. Also reduce the thickness of the top silicon layer 53 of the SOI wafer.

Step 7 (FIG. 23A), remove the silicon nitride layer 8 on the bottom surface of the silicon wafer 64 by using dry reactive ion etching or hot concentrated phosphoric acid, and remove the silicon dioxide layer 7 by using dry reactive ion etching or buffered hydrofluoric acid to form one half part of the accelerometer.

Step 8 (FIG. 23B), bond two half parts, which are made according to the previous steps, along their bottom surfaces; thus form a complete accelerometer.

Step 9 (FIG. 24A), deep etch to remove two of the top silicon layer 53; and remove the exposed silicon dioxide layer 7 by using dry reactive ion etching or buffered hydrofluoric acid, thus forms a movable accelerometer.

Step 10 (FIG. 24B), fabricate the bottom cap by hollowing the corresponding area, and deposit metal as electrodes.

Step 11 (FIG. 25A), bond the accelerometer with the bottom cap.

Step 12 (FIG. 25B), deposit metal on top of the bottom silicon layer 63 to form electrodes.

The deep etching or etching method is selected from one or more following methods, dry etching or wet etching; and the dry etching comprises silicon deep reactive ion etching or reactive ion etching.

Figure 4:
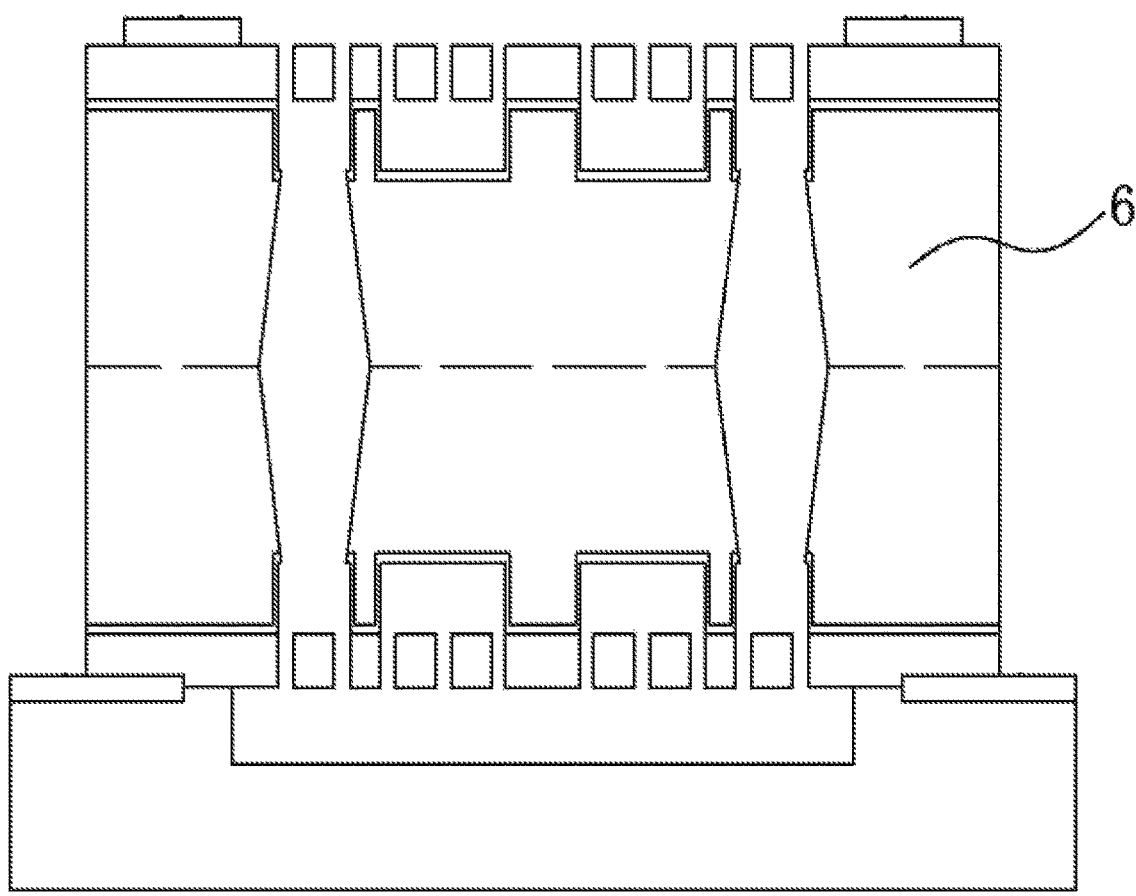
FIG. 4 is a structure scheme of the present invention in one embodiment.
Figure 5:
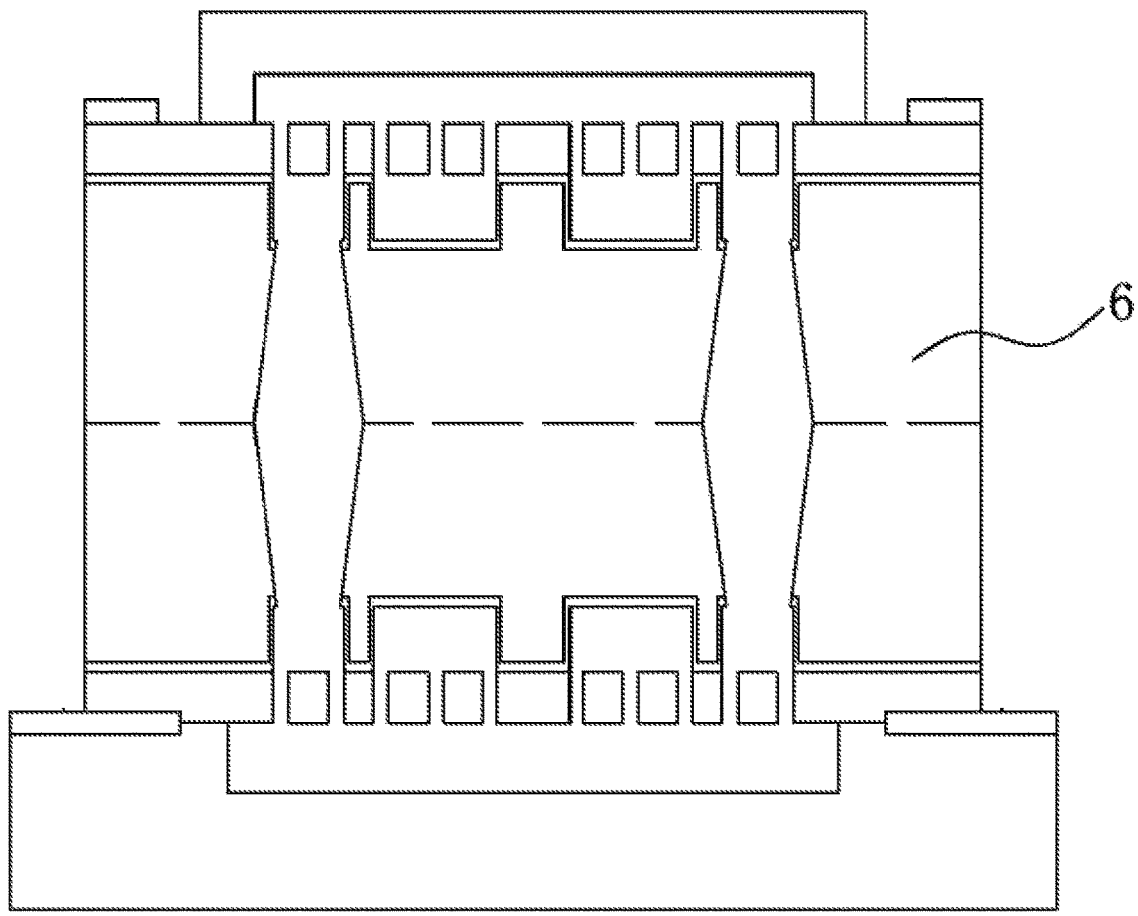
FIG. 5 is a structure scheme of the present invention in another embodiment.
Figure 6A:
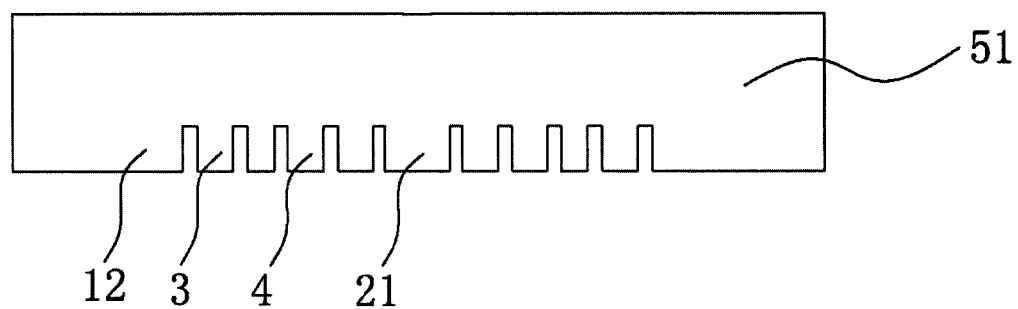
FIGS. 6A and 6B are diagrams of step 1 and step 2, respectively of the first fabrication technique in accordance with the present invention.
Figure 6B:
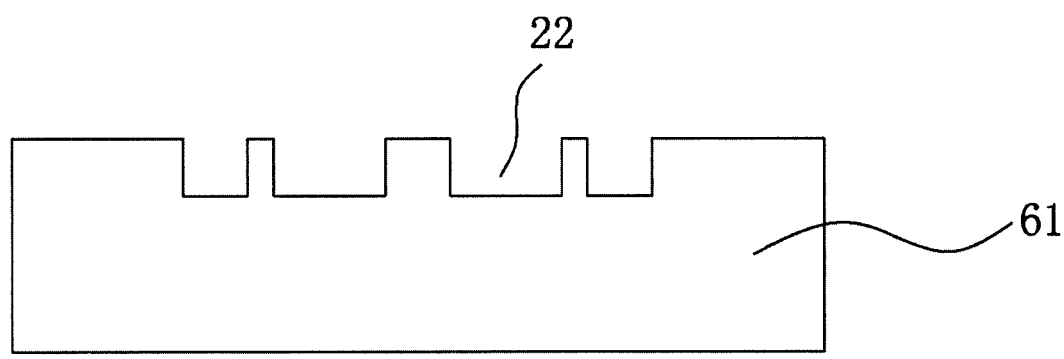
Figure 7A:
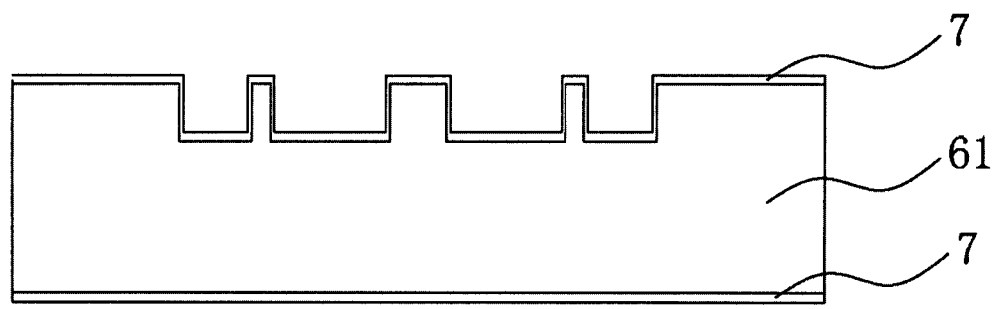
FIGS. 7A and 7B are diagrams of step 3 and step 4, respectively, of the first fabrication technique in accordance with the present invention.
Figure 7B:
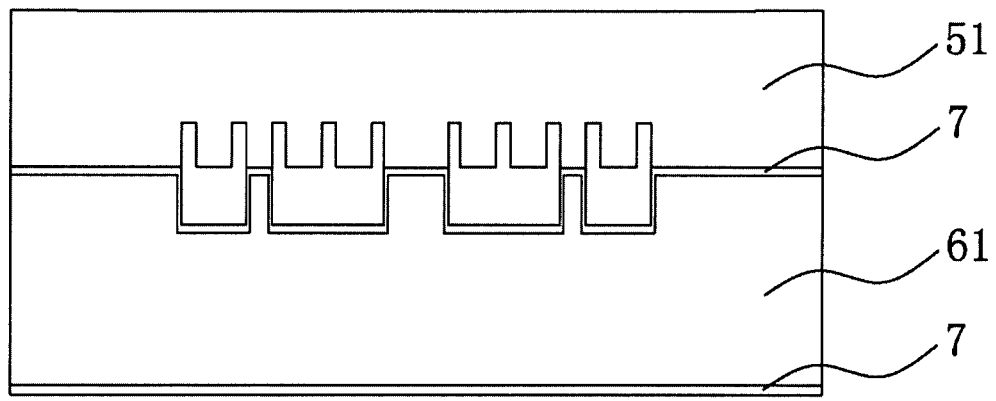
Figure 8A:
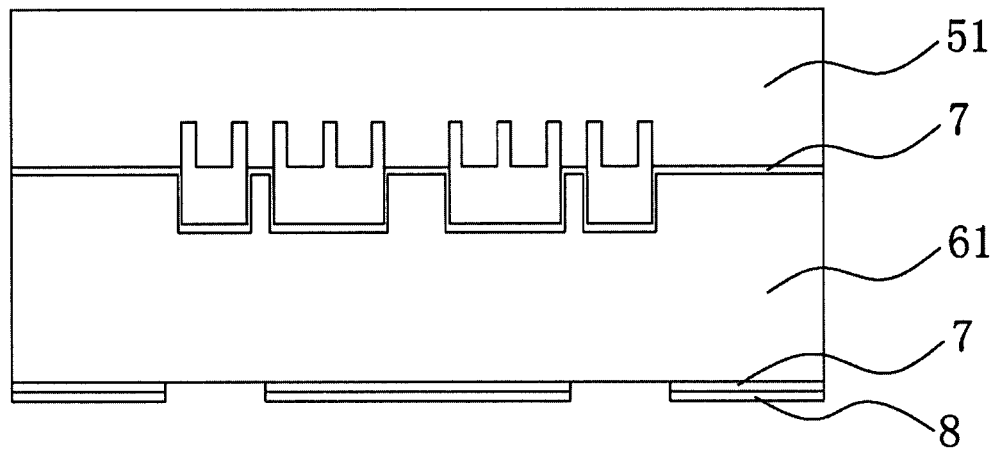
FIGS. 8A and 8B are diagrams of step 5 and step 6, respectively, of the first fabrication technique in accordance with the present invention.
Figure 8B:
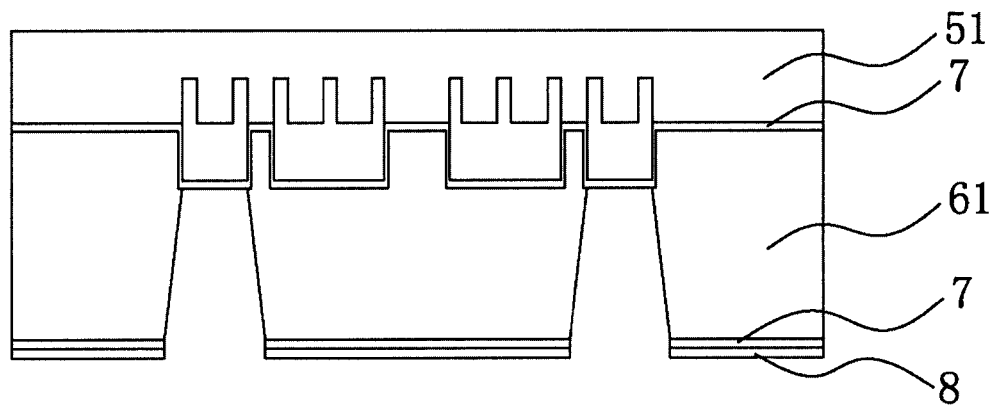
Figure 9A:
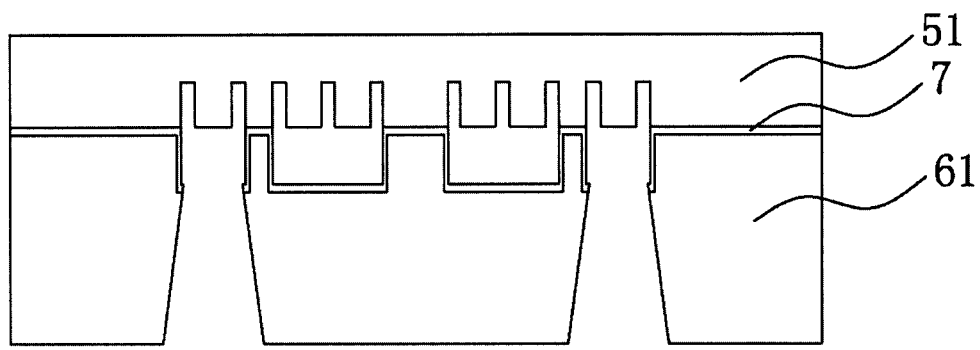
FIGS. 9A and 9B are diagrams of step 7 and step 8, respectively, of the first fabrication technique in accordance with the present invention.
Figure 9B:
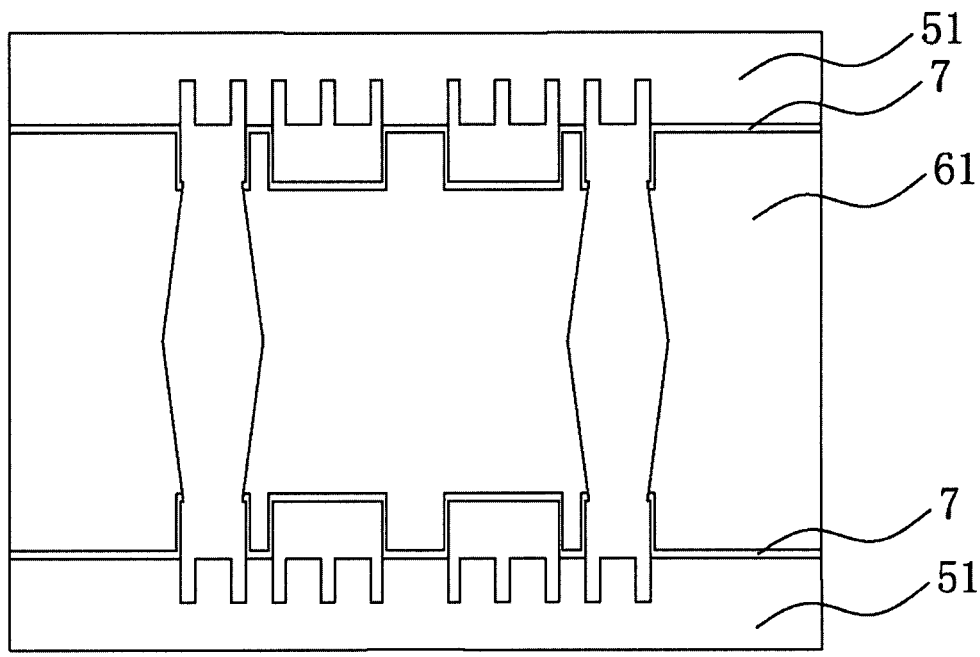
Figure 10A:
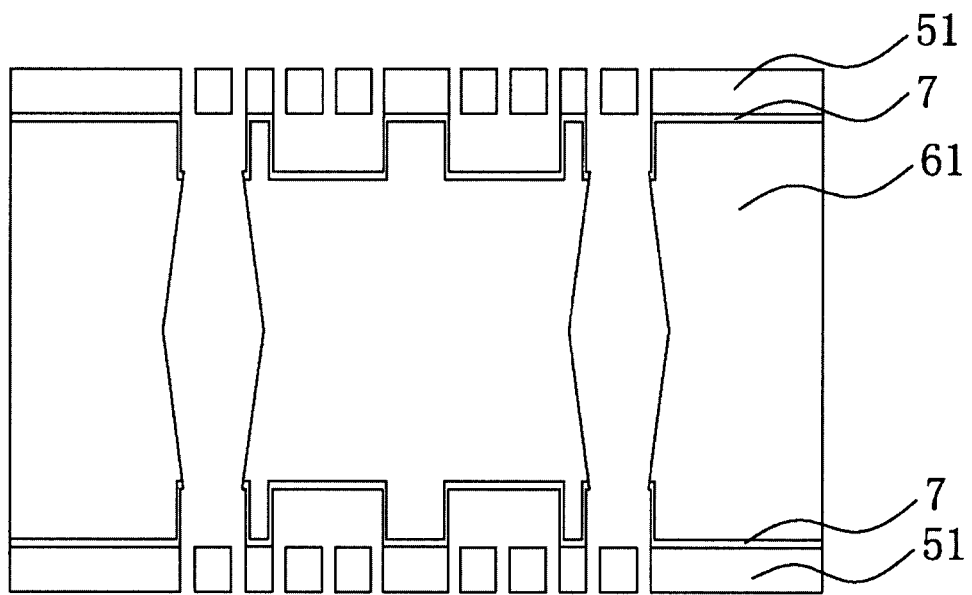
FIGS. 10A and 10B are diagrams of step 9 and step 10, respectively, of the first fabrication technique in accordance with the present invention.
Figure 10B:
Figure 11A:
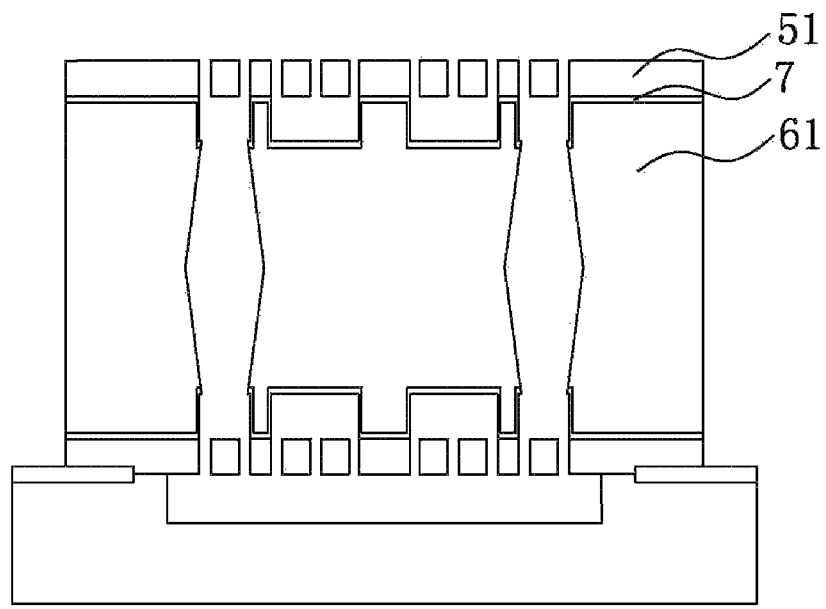
FIGS. 11A and 11B are diagrams of step 11 and step 12, respectively, of the first fabrication technique in accordance with the present invention.
Figure 11B:
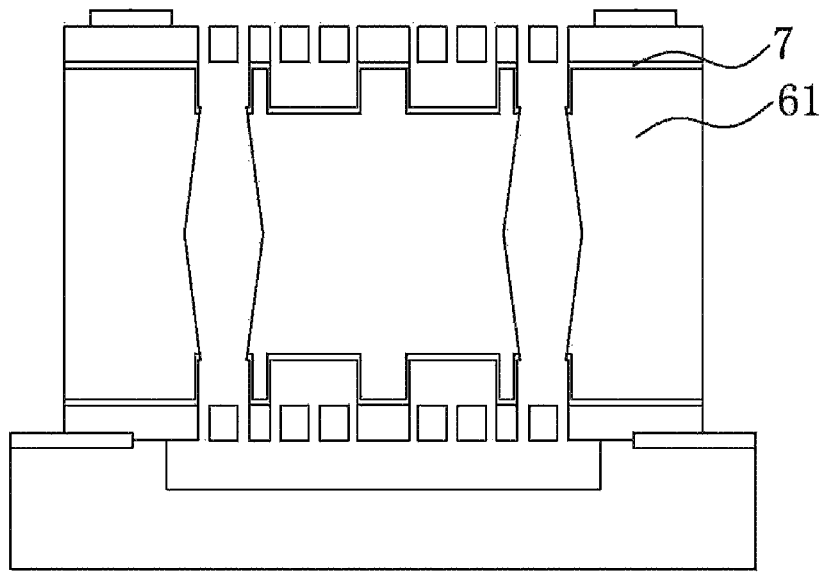
Figure 12A:
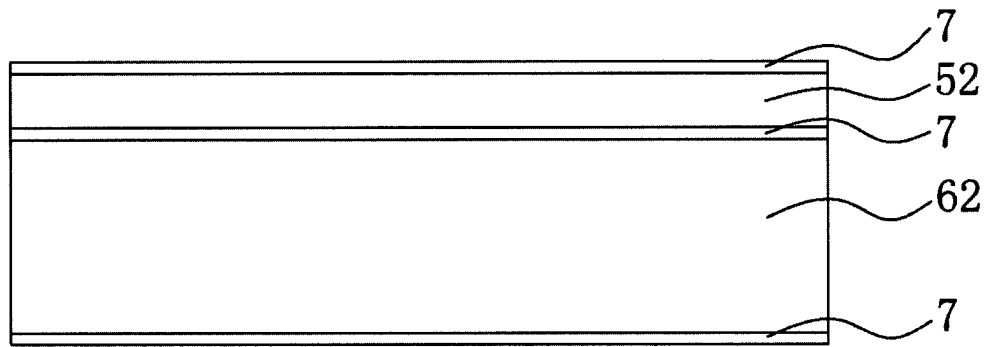
FIGS. 12A and 12B are diagrams of step 1 and step 2, respectively, of the second fabrication technique in accordance with the present invention.
Figure 12B:
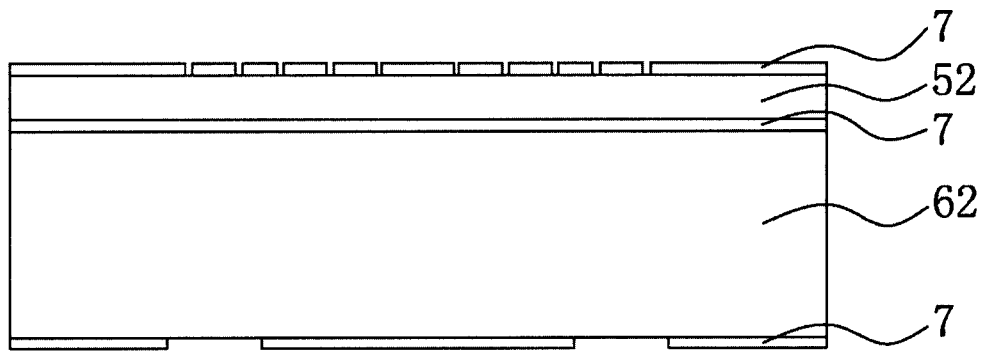
Figure 13A:
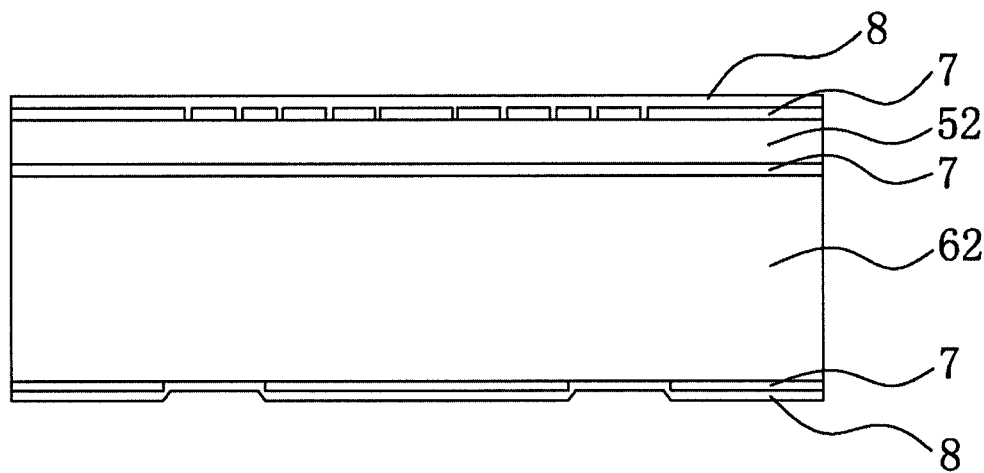
FIGS. 13A and 13B are diagrams of step 3 and step 4, respectively, of the second fabrication technique in accordance with the present invention.
Figure 13B:
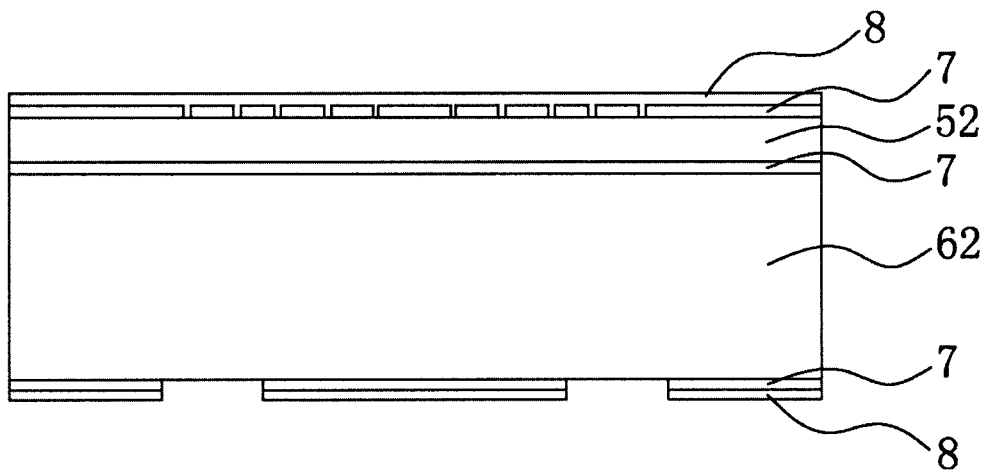
Figure 14A:
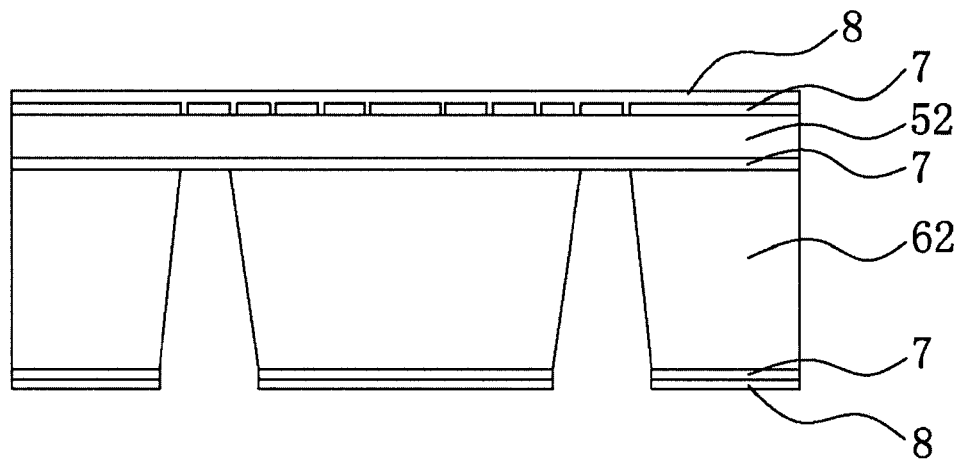
FIGS. 14A and 14B are diagrams of step 5 and step 6, respectively, of the second fabrication technique in accordance with the present invention.
Figure 14B:
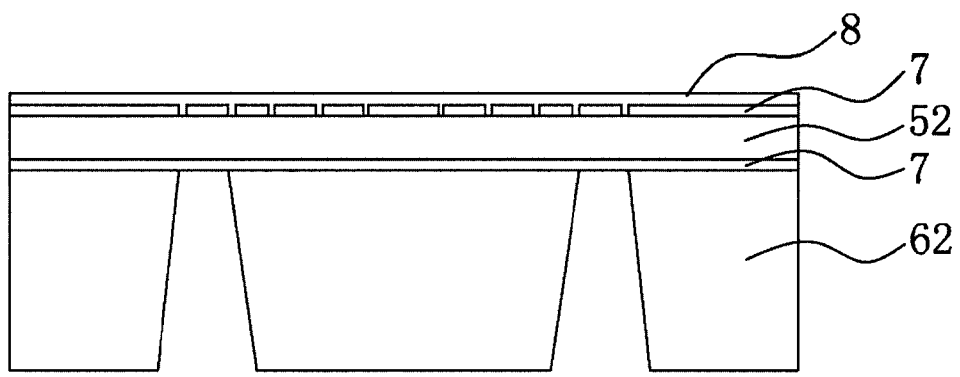
Figure 15A:
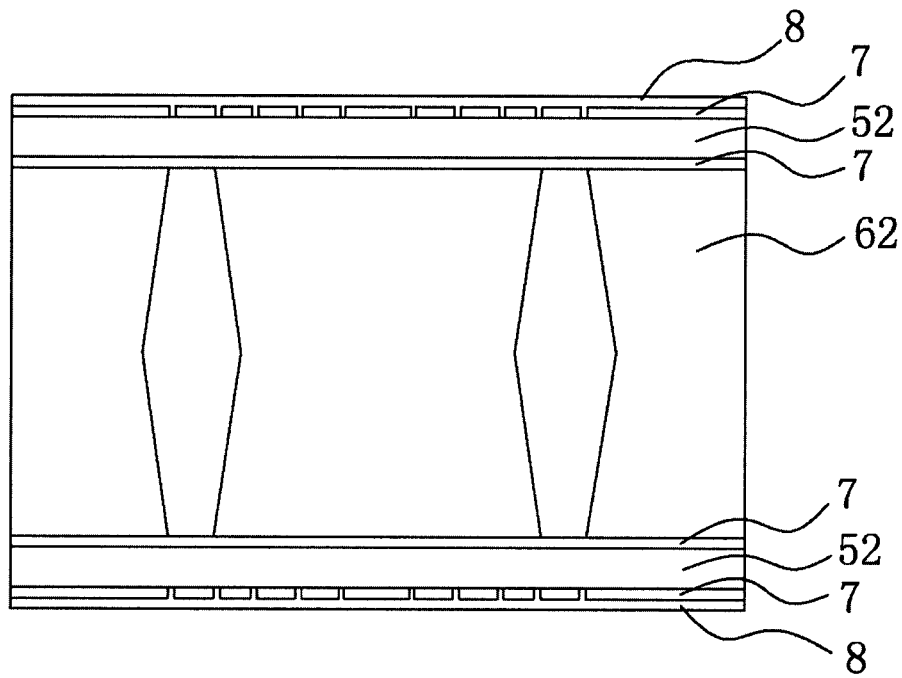
FIGS. 15A and 15B are diagrams of step 7 and step 8, respectively, of the second fabrication technique in accordance with the present invention.
Figure 15B:
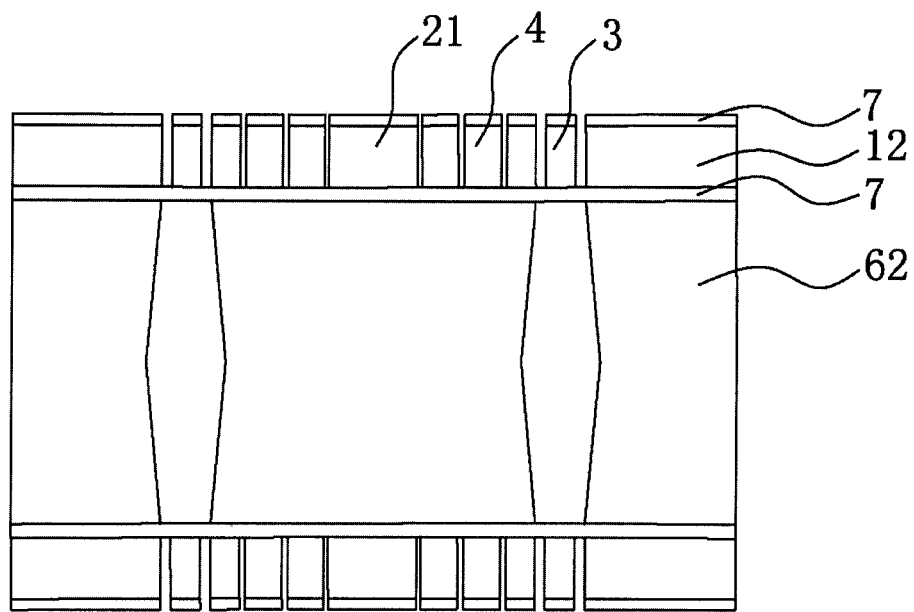
Figure 16A:
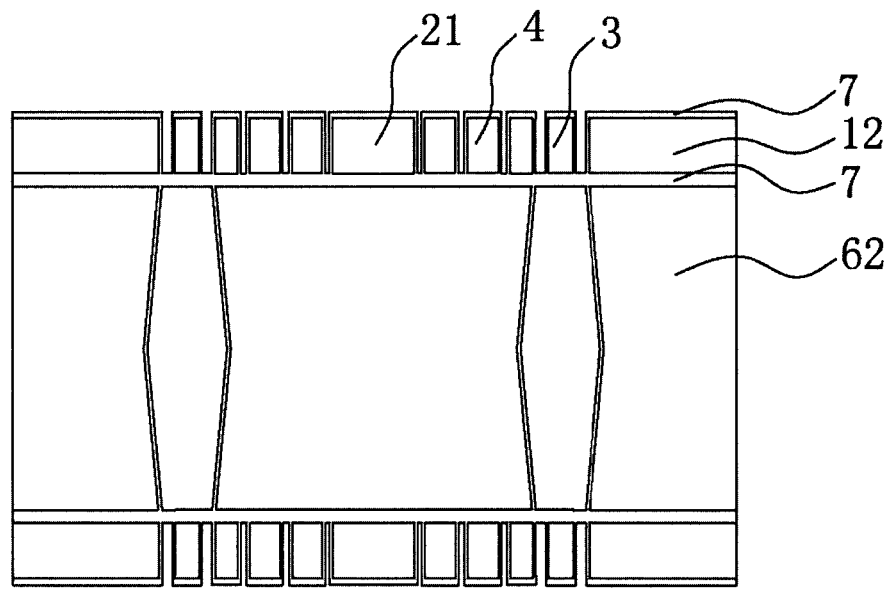
FIGS. 16A and 16B are diagrams of step 9 and step 10, respectively, of the second fabrication technique in accordance with the present invention.
Figure 16B:
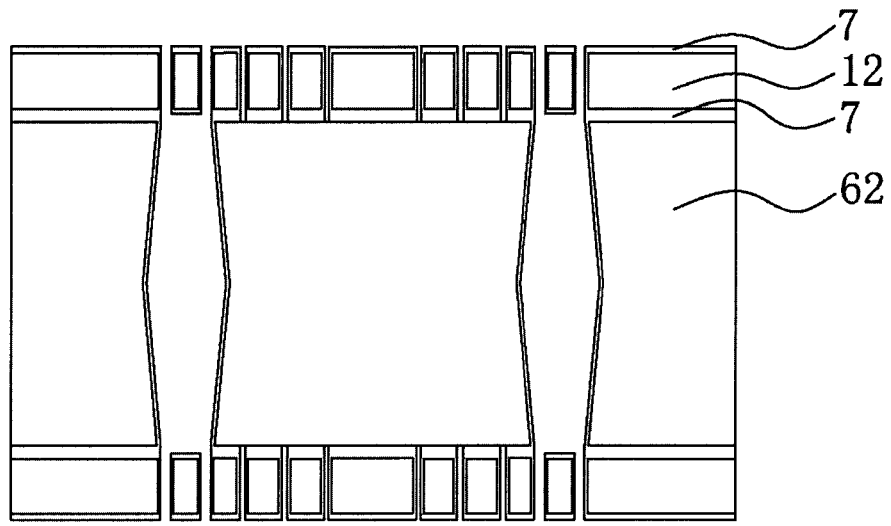
Figure 17A:
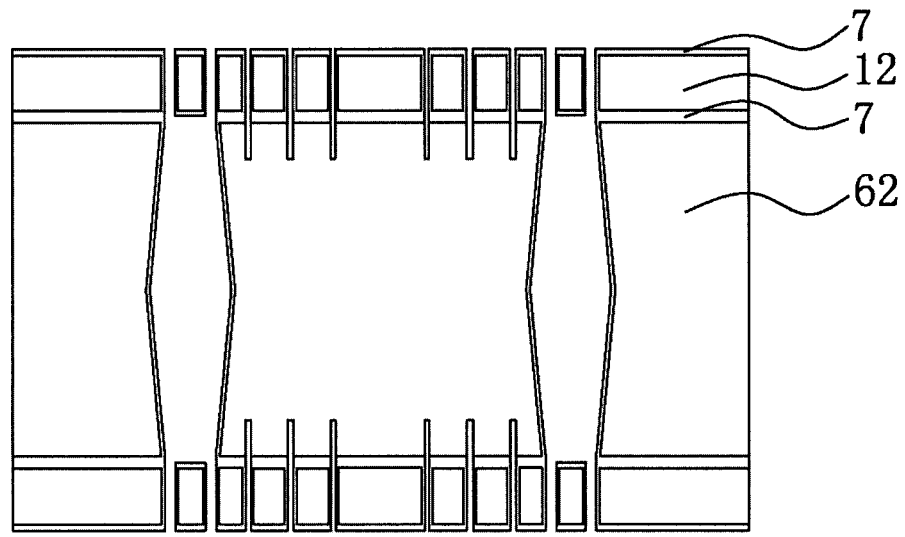
FIGS. 17A and 17B are diagrams of step 11 and step 12, respectively, of the second fabrication technique in accordance with the present invention.
Figure 17B:
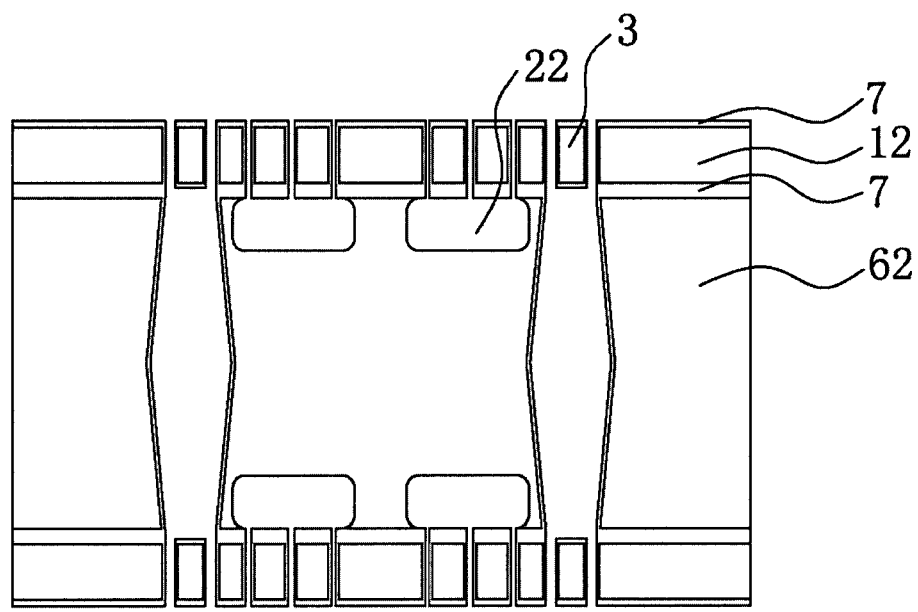
Figure 18A:
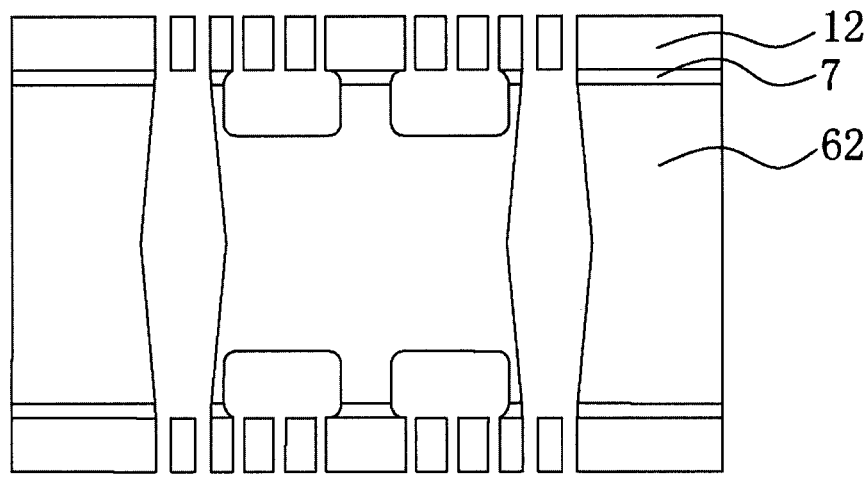
FIGS. 18A and 18B are diagrams of step 13 and step 14, respectively, of the second fabrication technique in accordance with the present invention.
Figure 18B:
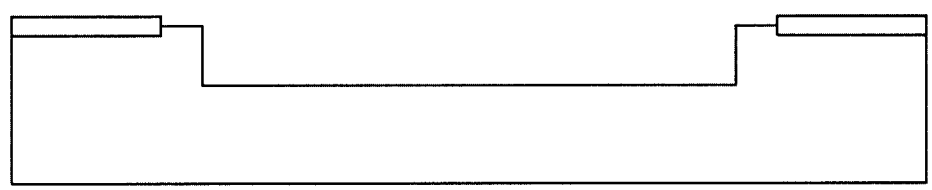
Figure 19A:
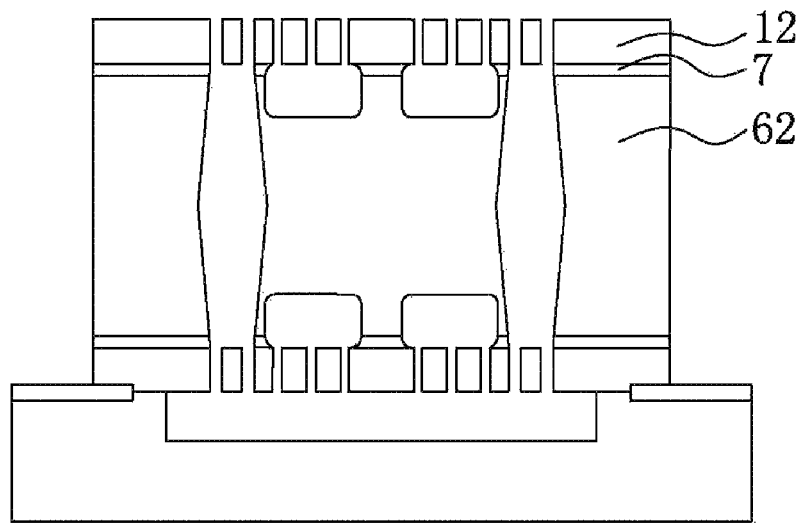
FIGS. 19A and 19B are diagrams of step 15 and step 16, respectively, of the second fabrication technique in accordance with the present invention.
Figure 19B:
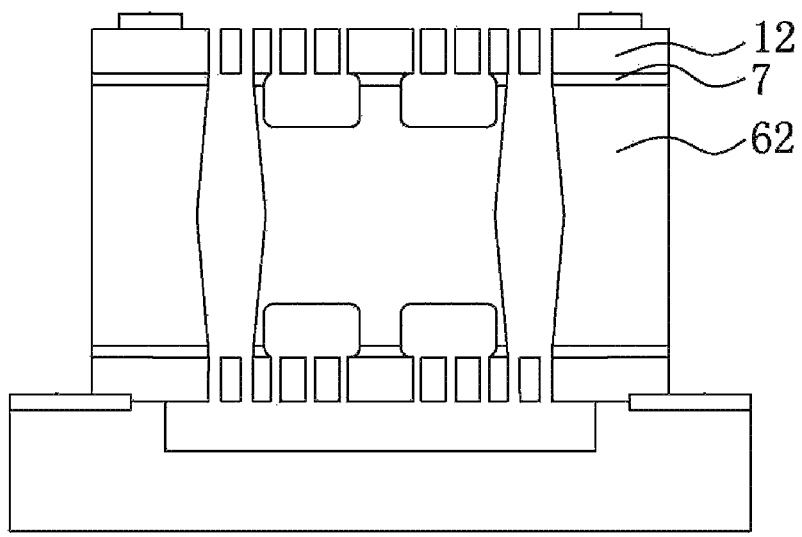
Figure 20A:
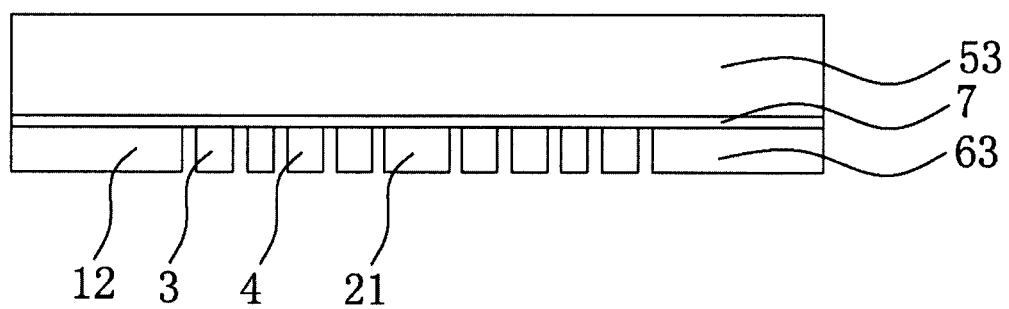
FIGS. 20A and 20B are diagrams of step 1 and step 2, respectively, of the third fabrication technique in accordance with the present invention.
Figure 20B:
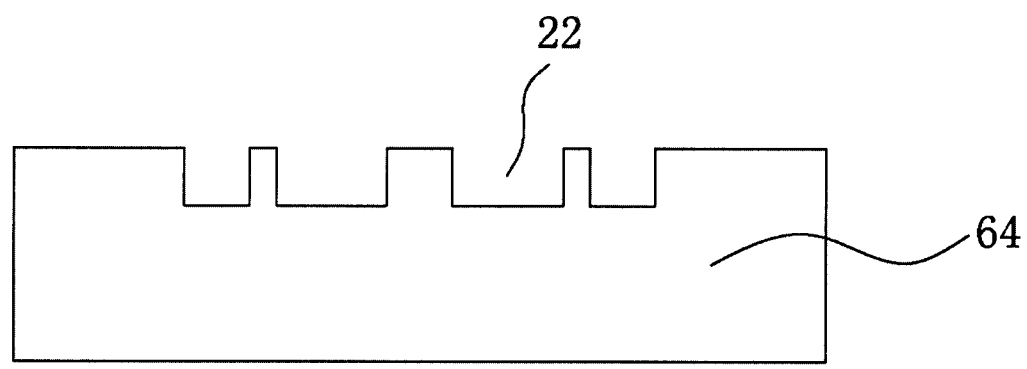
Figure 21A:
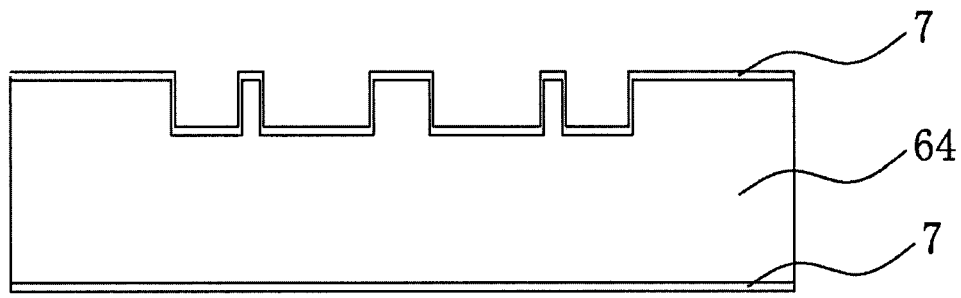
FIGS. 21A and 21B are diagrams of step 3 and step 4, respectively, of the third fabrication technique in accordance with the present invention.
Figure 21B:
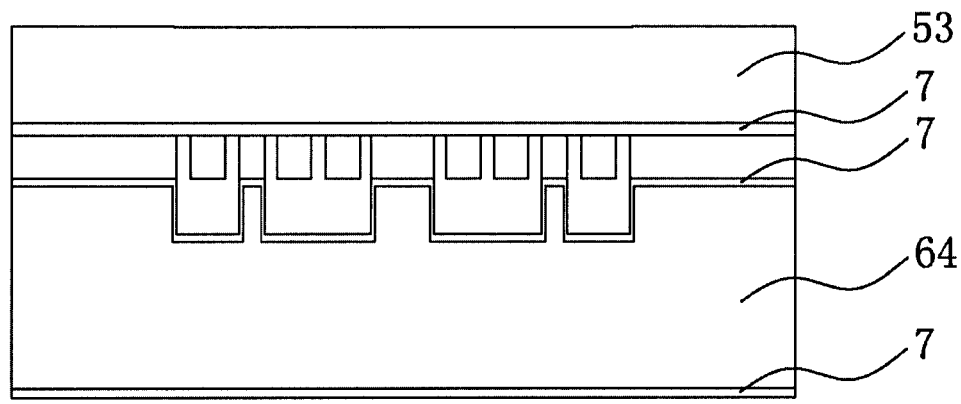
Figure 22A:
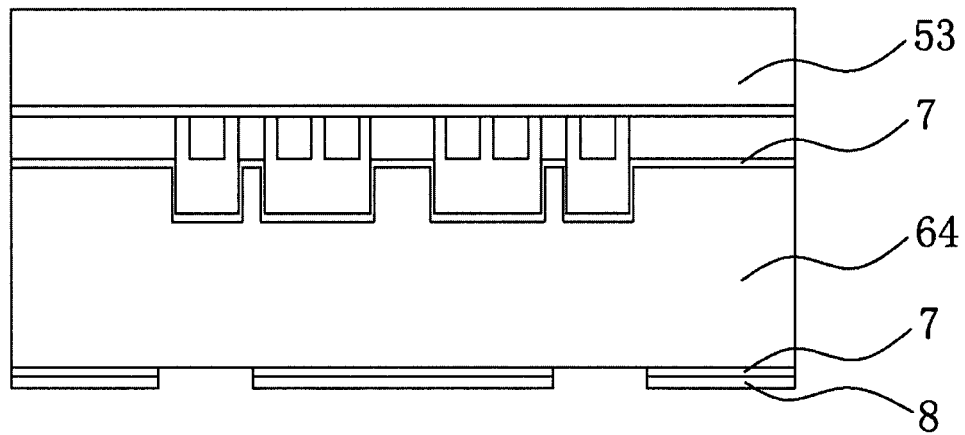
FIGS. 22A and 22B are diagrams of step 5 and step 6, respectively, of the third fabrication technique in accordance with the present invention.
Figure 22B:
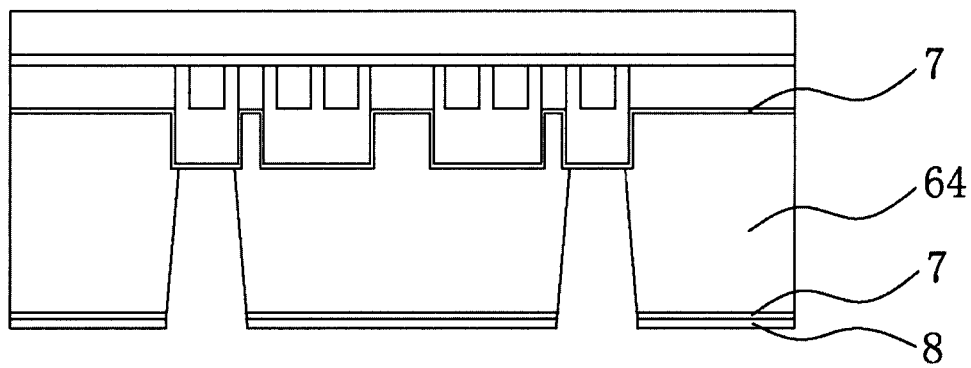
Figure 23A:
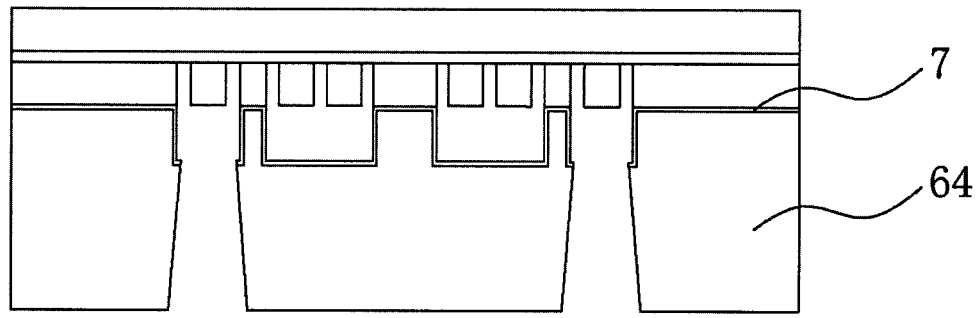
FIGS. 23A and 23B are diagrams of step 7 and step 8, respectively, of the third fabrication technique in accordance with the present invention.
Figure 23B:
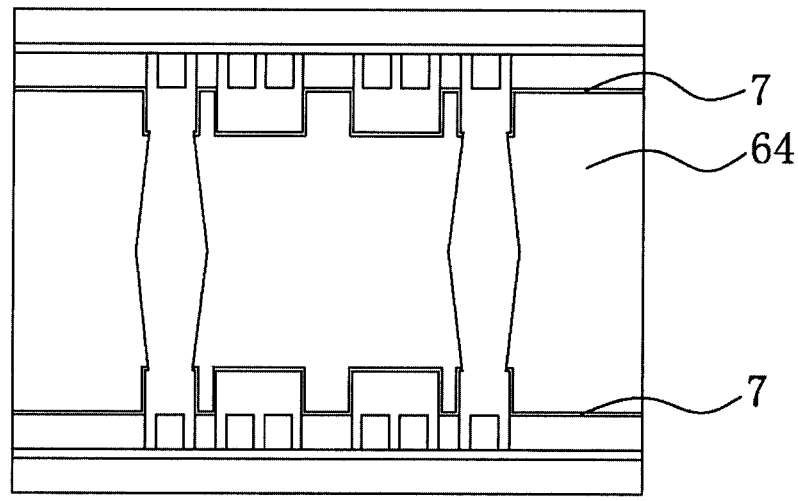
Figure 24A:
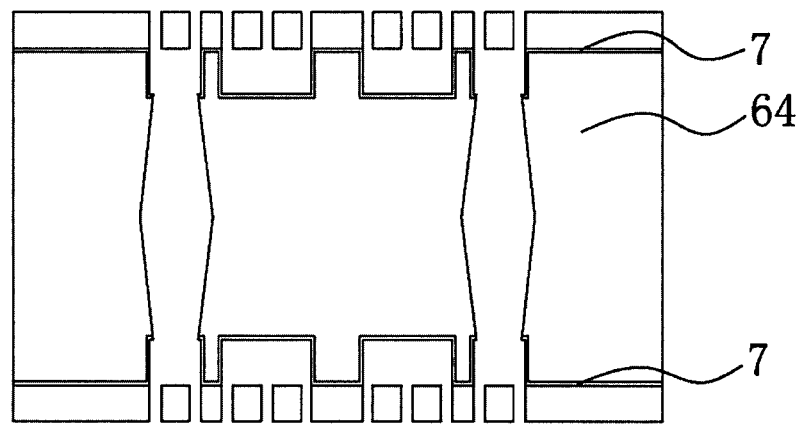
FIGS. 24A and 24B are diagrams of step 9 and step 10, respectively, of the third fabrication technique in accordance with the present invention.
Figure 24B:
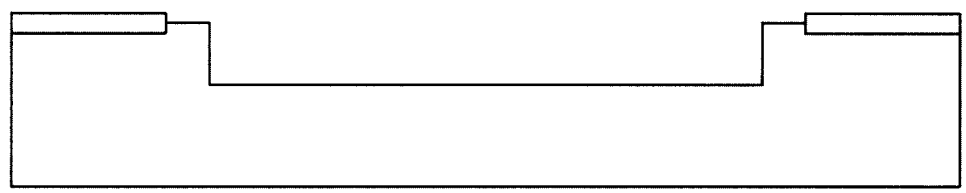
Figure 25A:
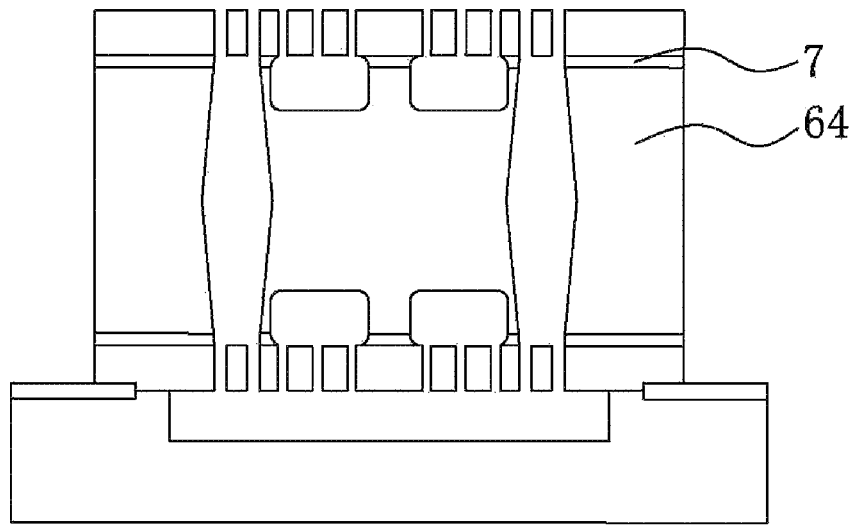
FIGS. 25A and 25B are diagrams of step 11 and step 12, respectively, of the third fabrication technique in accordance with the present invention.
Figure 25B:
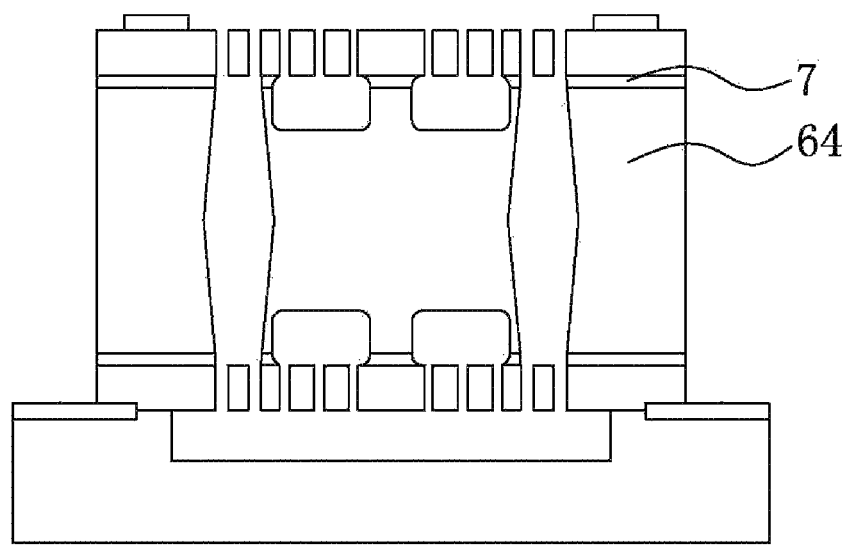

Furthermore, with reference to FIG. 4, the fabrication process of the present accelerometer also includes packaging the accelerometer with the top cap and the bottom cap. A person skilled in art can select the material for the top and bottom caps based on the performance requirements and cost factors. The fabrication process and the packaging process are well known in the field of art and will not be described in details.

The present invention uses comb structure to detect acceleration. The detecting parts are fabricated by photolithography and deep reactive ion etching, its accuracy is higher bonding process, which is widely used in fabricating traditional capacitive plate accelerometers. Also, the present accelerometer has a relatively small squeeze-film damping force, which makes it possible to package in a non-vacuum environment. Thus the cost for packaging and fabrication is reduced. Since the detecting parts are the comb structures located on top of the mass, the bonding accuracy requirement for bonding two half parts is also lower. Furthermore, a person skill in art can select different types of material and fabrication method based on his needs. Since electrodes are placed on the first connecting parts 21 and the second connecting parts 12, there is no electrodes on the top and bottom cap of the accelerometer. Thus, the bonding accuracy, fabrication process for the caps are relatively simple, and a person skilled in art can choose relatively cheap materials to fabricate the caps. The present invention has a high degree of freedom in fabrication process, a person skilled in art can choose the materials and fabrication technique based on his needs.

The invention claimed is:

1. A process for fabricating a symmetrical MEMS accelerometer, comprising:
   fabricating a pair of half parts for an accelerometer, for each half part:
      etching a plurality of holes on the bottom surface of the silicon-on-insulator wafer with depth to the buried oxide layer using photolithography and deep etching, thus forming the first connecting part, the second connecting part, the resilient beams, and the comb structures;
      etching a plurality of hollowed parts on the top surface of the silicon wafer using photolithography and deep etching;
      forming a silicon dioxide layer on the top and bottom surface of the silicon wafer using thermal oxidation or chemical deposition;
      bonding the top surface of the silicon wafer with the bottom surface of the silicon-on-insulator wafer;
      depositing silicon nitride on the bottom surface of the silicon wafer, then removing part of the silicon nitride and the silicon dioxide layer on the bottom surface of the silicon wafer using photolithography and etching to expose part of the bottom surface of the silicon wafer;
      deep etching the exposed parts of the bottom surface of the silicon wafer to the silicon dioxide layer to form the mass, and reducing the thickness of the silicon-on-insulator wafer; and
      removing the silicon nitride layer and exposed parts of silicon dioxide layer on the bottom surface of the silicon wafer by etching;
   bonding the two half parts of the accelerometer along their bottom surface;
   removing the top silicon layers and silicon dioxide layers to form the accelerometer using deep etching and etching;
   fabricating the bottom cap by hollowing the corresponding area, and depositing metal as electrodes;
   bonding the accelerometer with the bottom cap; and
   depositing metal on the first silicon wafer to form electrodes.

2. The process of claim 1, wherein the deep etching or etching method is selected from one or more following methods: dry etching or wet etching; and the dry etching comprises silicon deep reactive ion etching or reactive ion etching.

3. The process of claim 1, wherein, the etchant for etching the silicon layer comprises at least one of the following etchants: potassium hydroxide, tetramethylammonium hydroxide, ethylenediamine pyrocatechol or gaseous xenon difluoride.

4. The process of claim 1, wherein the etchant for etching the silicon dioxide layer comprises at least one of the following etchants: buffered hydrofluoric acid, 49% hydrofluoric acid or gaseous hydrogen fluoride.

5. The process of claim 1, wherein the etchant for etching the silicon nitride layer comprises at least one of the following etchants: hot concentrate phosphoric acid and hydrofluoric acid.

* * * * *